United States Patent [19]

McLeod et al.

[11] Patent Number: 4,776,893
[45] Date of Patent: Oct. 11, 1988

[54] GAAS ON GASB MECHANICALLY STACKED PHOTOVOLTAIC CELLS, PACKAGE ASSEMBLY, AND MODULES

[75] Inventors: Paul S. McLeod, Berkeley; John A. Cape, San Rafael, both of Calif.; Lewis M. Fraas, Isaquah, Wash.; Larry D. Partain, San Mateo, Calif.

[73] Assignee: Chevron Research Company, San Francisco, Calif.

[21] Appl. No.: 921,566

[22] Filed: Oct. 21, 1986

Related U.S. Application Data

[63] Continuation-in-part of Ser. No. 740,362, Jun. 3, 1985, Pat. No. 4,658,086.

[51] Int. Cl.⁴ .................. H01L 31/06; H01L 25/08
[52] U.S. Cl. ..................................... 136/249; 136/244
[58] Field of Search ........................... 136/244, 249 TJ

[56] References Cited

U.S. PATENT DOCUMENTS 2,949,498  8/1960  Jackson ............................ 136/244
4,658,086  4/1987  McLeod et al. ................. 136/249 TJ

OTHER PUBLICATIONS

J. A. Hutchby et al., Cont. Record 18th IEEE Photoroltaic Specialists Conf. (Oct. 1985), pp. 20–27 (Published Apr. 1986).

C. Verié, Conf. Record, 18th IEEE Photoroltaic Specialists Conf. (Oct. 1985, pp. 528–532 (Published Apr. 1986).

L. M. Fraas et al., "III-V Cell Research at Chevron," after Jun. 4, 1985.

L. D. Partain et al., "Vacuum MOVCD Fabrication of High Efficiency Cells for Multijunction Applications" Apr. 30–May 2, 1985.

L. M. Fraas et al., "Epitaxial Growth from Organometallic Sources in High Vacuum", after Jun 19, 1985.

L. D. Partain et al., "High Efficiency Mechanical Stack using A GaAsP Cell on a Transparent GaP Wafer," Proceedings 18th IEEE Photovoltaic Specialists Conference Oct. 21-25, 1985, pp. 539-545.

Primary Examiner—Aaron Weisstuch
Attorney, Agent, or Firm—S. R. La Paglia; E. J. Keeling; E. A. Schaal

[57] ABSTRACT

The present invention is an apparatus of mechanically stacked photovoltaic cells having two cells. The bottom cell has a layer of GaSb having regions of different conductivity forming a homojunction therein. The GaSb layer is sandwiched between a conductive substrate and a bottom passivating layer. In the bottom cell is a means for forming electrical contacts to the substrate and the incident surface of the bottom passivating layer. The top cell has a layer of GaAs having regions of different conductivity forming a homojunction therein, a top passivating layer contacting the surface of the layer of GaAs which is incident to solar radiation, and a means for forming electrical contacts to the layer of GaAs opposed to solar radiation and the incident surface of the passivating layer.

13 Claims, 4 Drawing Sheets

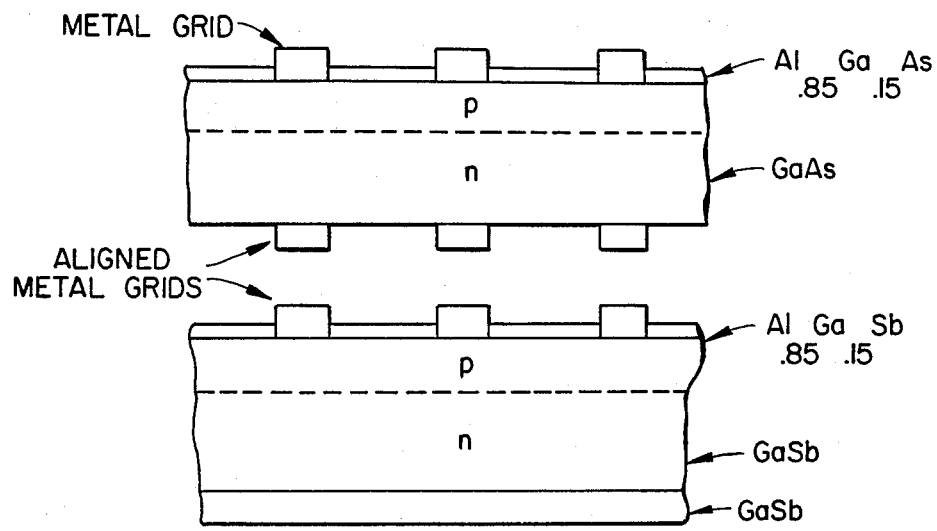
FIG._1.
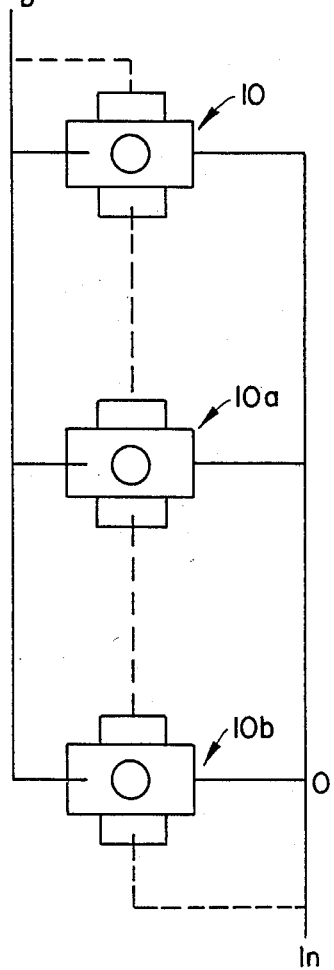
FIG._6.

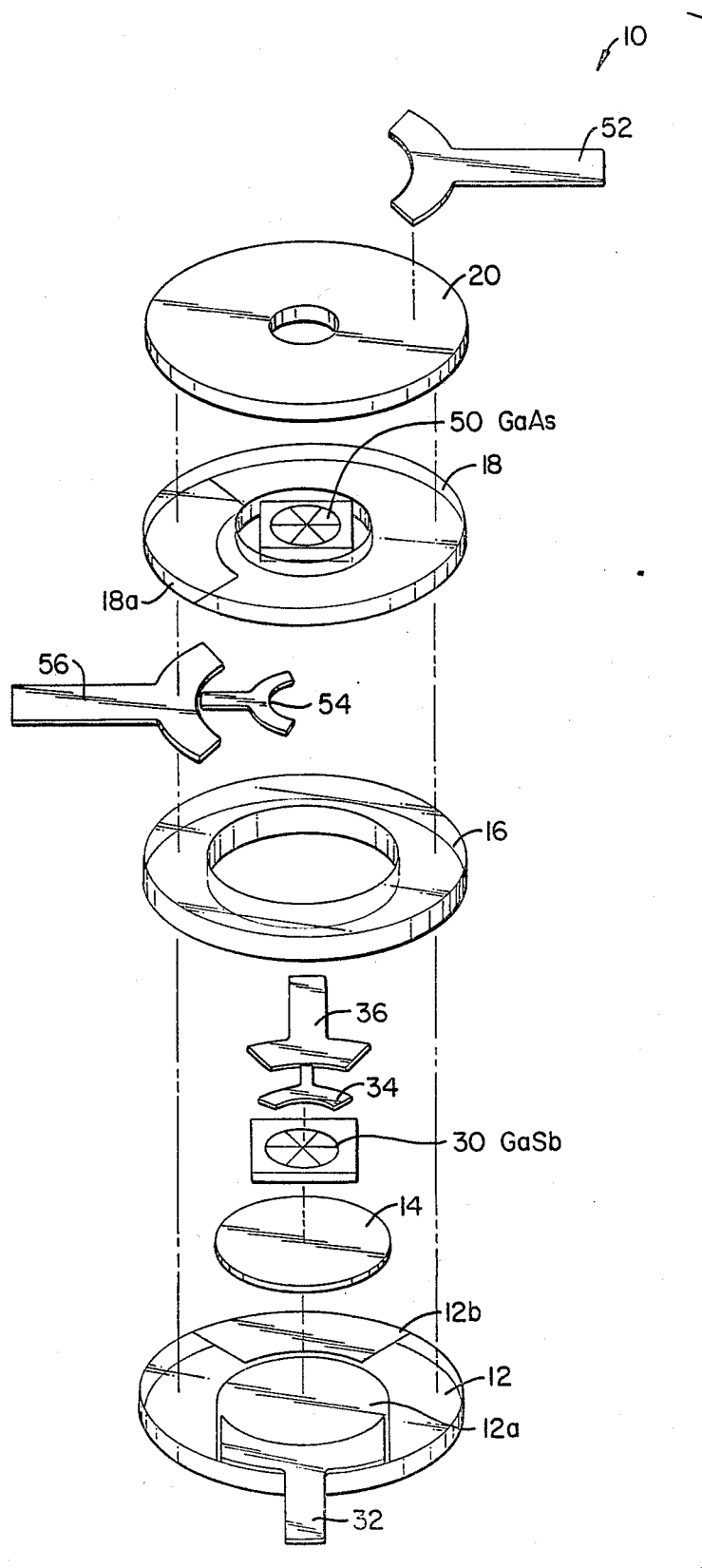
FIG._2.

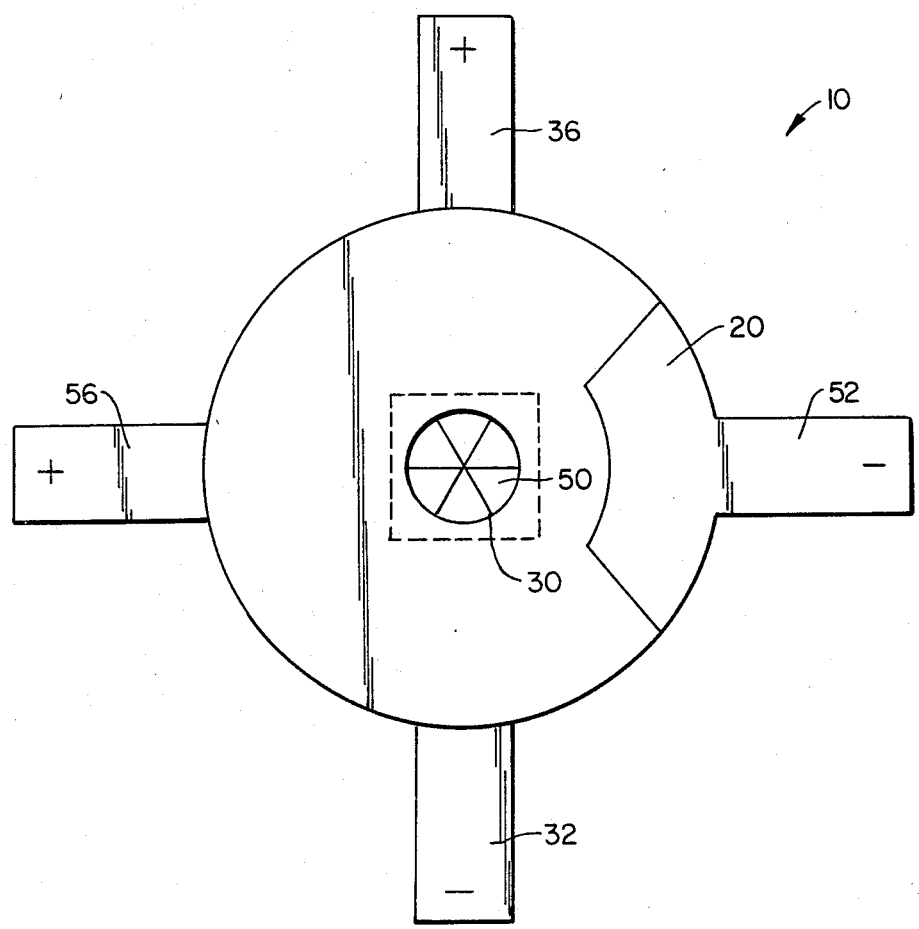
FIG._4.
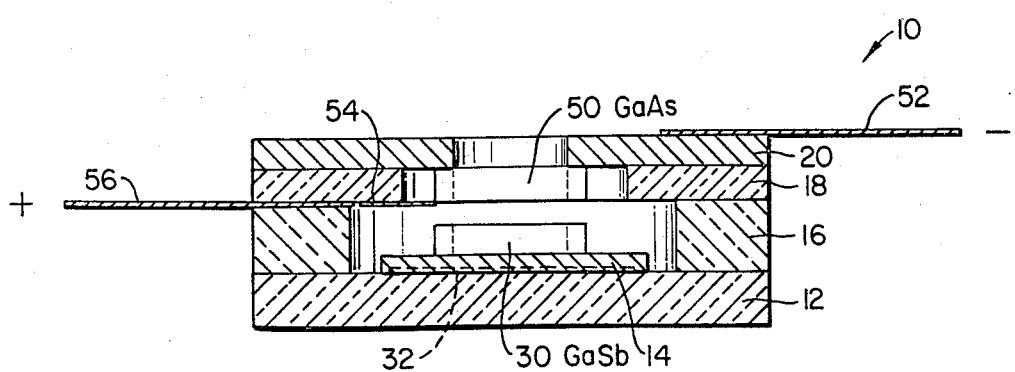
FIG._3.

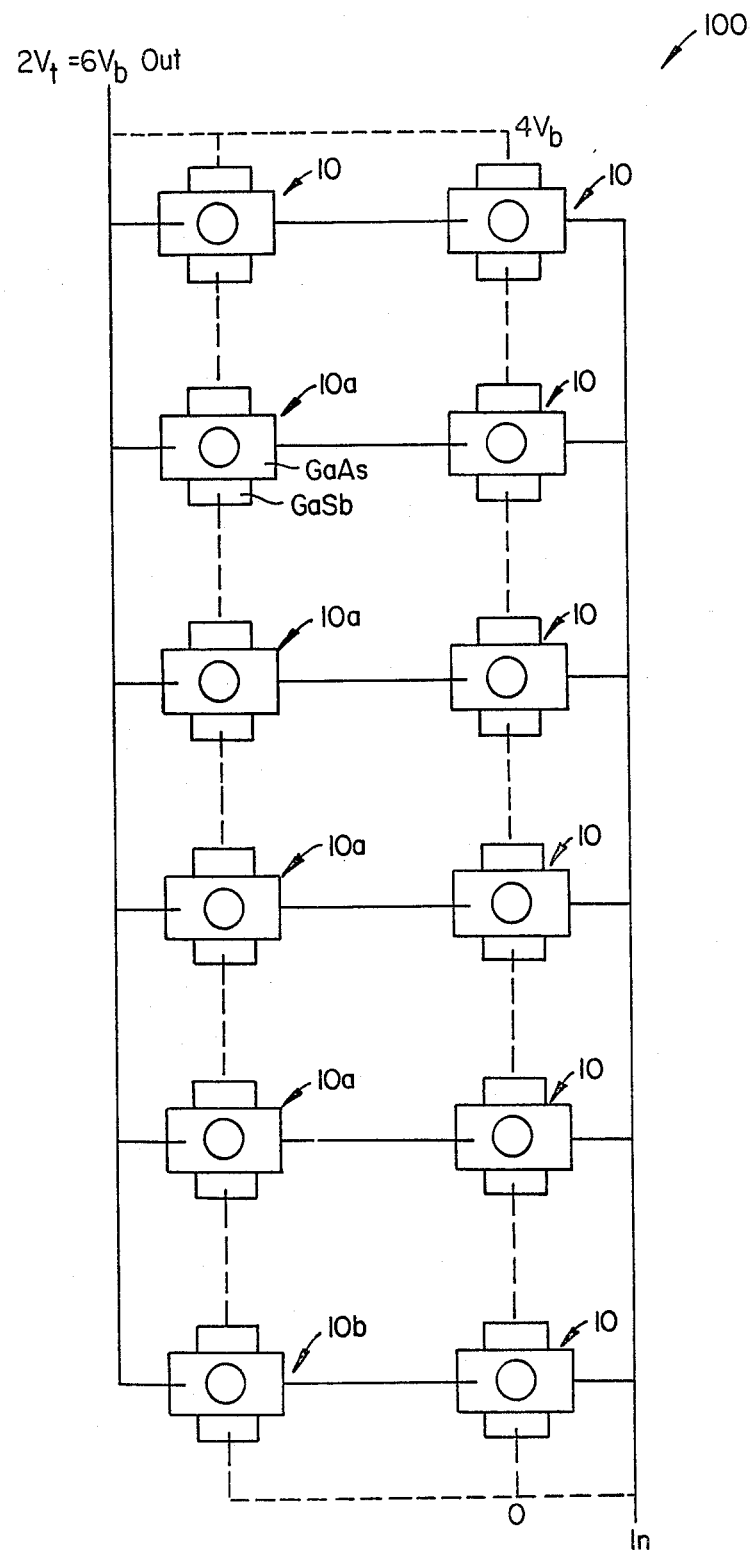
FIG._5.

GAAS ON GASB MECHANICALLY STACKED PHOTOVOLTAIC CELLS, PACKAGE ASSEMBLY, AND MODULES

CROSS-REFERENCES TO RELATED APPLICATIONS

This application is a continuation-in-part of our application entitled "Photovoltaic Cell Package Assembly for Mechanically Stacked Photovoltaic Cells", filed on June 3, 1985 and assigned U.S. Ser. No. 740,362 which issued as U.S. Pat. No. 4,658,086. Said application is completely incorporated herein by reference for all purposes.

This invention relates to photovoltaic cells. More specifically, this invention relates to mechanically stacked photovoltaic cells.

BACKGROUND OF THE INVENTION

To increase the overall efficiency of photovoltaic cells and extract the maximum amount of energy from solar radiation, researchers have investigated various multi-color photovoltaic cells. These multi-color photovoltaic cells can be divided into two general categories. The first category covers monolithic multi-color photovoltaic cells. A monolithic multi-color photovoltaic cell is a photovoltaic cell which has distinct regions optimized to absorb different portions of the solar radiation spectrum in a single cell. U.S. Pat. Nos. 4,404,421 and 4,451,691, incorporated herein by reference for all purposes, describe suitable monolithic cells. Although these monolithic cells are attractive from a system and manufacturing point of view, they will require considerable materials research to bring them to commercialization.

A second approach involves tandem mechanically stacked two-color photovoltaic cells. These cells comprise independent photovoltaic cells which are optimized to the different portions of the solar spectrum and are mechanically and electrically interconnected. These tandem mechanically stacked two-color photovoltaic cells offer a shorter path to commercialization primarily because one of the cells can be an already developed cell, such as Si or GaAs. U.S. application Ser. No. 645,456 filed Aug. 28, 1984, incorporated herein by reference for all purposes, describes a suitable high-band gap photovoltaic cell. Examples of high-band gap photovoltaic cells are GaAsP or AlGaAs or GaAs photovoltaic cells, and the like.

These mechanically stacked cells often fall into the category of photovoltaic cells known as concentrator photovoltaic cells. A concentrator photovoltaic cell is a high efficiency photovoltaic cell which utilizes some sort of focusing optics to concentrate solar radiation from a strength of one sun to many suns, i.e., on the order of 50 to 1000 or more suns. The concentration of the solar radiation permits the photovoltaic cells to produce a greater amount of electricity per unit area than lower efficiency flat plate photovoltaic cells. This makes them especially useful for space applications where weight is of great concern and in jobs which require maximum electrical output with a minimum amount of surface area. However, a drawback to concentrator photovoltaic cells is a means for interconnecting the two mechanically stacked photovoltaic cells and dissipating the heat generated by the concentration of the solar radiation. Thus, it would be highly desirable to have mechanically stacked apparatus which can interconnect two photovoltaic cells while minimizing the effects of heat generated by the concentrated solar radiation.

In conventional mechanical stack designs, in particular, those using thin top cells, the heat generated in the top cell must be transmitted through the transparent adhesive bonding the two cells together. This can lead to undesirably high cell temperatures. To avoid this difficulty, it would be highly desirable to have a package design wherein heat spreaders incorporated therein are used both for the bottom and top cells. A further advantage would be to incorporate a wafer for the top cell that is thick enough to conduct the heat laterally to the top heat spreader. A still further advantage would be to have a design which isolates the cells so that the effects of thermal expansion are reduced or minimized.

In monolithic cell designs, the top and bottom cells must generally be current matched or the performance of the cell is limited by the cell having the lower current. Since current matching different bandgap photovoltaic cells can sometimes be difficult, it would be desirable to have a package which permits voltage matching of the two cells. Voltage matching is beneficial because the voltages of the cells change very little with variations in solar spectrum or with the cell degradation with space radiation damage. Thus, it would also be highly desirable to have a package design which can dissipate the heat and permit the easy wiring of numerous mechanically stacked cells into a module wiring configuration for voltage matching instead of current matching.

Furthermore, it would be desirable to specify two component photovoltaic cell materials which will generate voltages which are simple multiples of each other where one of these photovoltaic cells is a well developed cell and the other can be rapidly developed to reach near its theoretical limit performance. Materials which can be rapidly developed are simple binary compounds with large optical absorption coefficients which have already been used as photodetectors.

SUMMARY OF THE INVENTION

The present invention is an apparatus of mechanically stacked photovoltaic cells having two cells: a bottom GaSb cell and a top GaAs cell. GaAs cells are already well developed and GaSb has been used as a material in photodiodes. The voltage of a GaAs cell will be three times that of a GaSb cell.

The bottom GaSb cell has a layer of GaSb having regions of different conductivity forming a homojunction therein. One surface of the GaSb layer contacts a conductive substrate, and the opposite surface of the GaSb layer contacts a passivating layer. Preferably, the passivating layer is a layer of $Al_yGa_{(1-y)}Sb$, more preferably, $Al_{0.85}Ga_{0.15}Sb$. Also contained in this cell is a means for forming electrical contacts to the substrate and the incident surface of the passivating layer.

The top GaAs cell has a layer of GaAs having regions of different conductivity forming a homojunction therein, a passivating layer contacting the surfaces of the layer of GaAs which is incident to solar radiation, and a means for forming electrical contacts to the layer of GaAs opposed to solar radiation and the incident surface of the passivating layer. Preferably, the passivating layer is a layer of $Al_xGa_{(1-x)}As$, more preferably, $Al_{0.85}Ga_{0.15}As$. The means for forming electrical contacts in the GaSb cell and the means for forming electrical contacts in the GaAs cell are aligned to prevent excessive shadowing of the GaSb cell.

In one embodiment, six GaSb cells are wired in series for every two GaAs cells wired in series to form a module of predetermined output voltage under illumination. In another embodiment, three GaSb cells are wired in series for every GaAs cell wired in series to form a module of predetermined output voltage under illumination.

The mechanically stacked apparatus includes top and bottom heat spreaders, insulating means to separate the two photovoltaic cells, and means for forming electrical contacts to the exposed surfaces of each of the cells incorporated into the assembly. The means for forming electrical contact permit the easy interconnection of the completed device in a voltage matching scheme to avoid the requirements of current matching the individual cells.

BRIEF DESCRIPTION OF THE DRAWINGS

In order to facilitate the understanding of this invention, reference will now be made to the appended drawings of preferred embodiments of the present invention. The drawings are exemplary only, and should not be construed as limiting the invention.

FIG. 1 illustrates a side view of one embodiment of the present invention.

FIG. 2 illustrates an exploded view of the photovoltaic cell package assembly for mechanically stacked photovoltaic cells of our invention.

FIG. 3 illustrates a cross sectional view of the assembly.

FIG. 4 illustrates a top view of the assembly.

FIG. 5 illustrates a voltage matching module wiring diagram incorporating twelve mechanically stacked photovoltaic assemblies.

FIG. 6 illustrates a voltage matching module wiring diagram incorporating three mechanically stacked photovoltaic assemblies.

DETAILED DESCRIPTION OF THE INVENTION

In its broadest aspect, the present invention is an apparatus of mechanically stacked photovoltaic cells having two cells: a bottom GaSb cell and a top GaAs cell.

The invention will be more clearly illustrated by referring to the figures. FIG. 1 illustrates a side view of one embodiment of a mechanically stacked photovoltaic cell package. A top GaAs cell is stacked on a bottom GaSb cell.

The top GaAs cell comprises a layer of GaAs having regions of different conductivity forming a homojunction therein, a top passivating layer contacting the surface of the GaAs layer which is incident to solar radiation, and means for forming electrical contacts to the GaAs layer opposed to solar radiation and the incident surface of the top passivating layer.

As shown in FIG. 1, the layer of GaAs has regions of different conductivity forming a homojunction therein. On the side of the homojunction incident to solar radiation, the GaAs layer is doped with a p-type dopant. On the opposing side, the GaAs layer is doped with an n-type dopant. A top passivating layer of $Al_xGa_{(1-x)}As$ contacts the surface of the GaAs layer which is incident to solar radiation. In FIG. 1, x is equal to 0.85. That figure also shows a means for forming electrical contacts to the layer of GaAs opposed to solar radiation and the incident surface of the top passivating layer. That means is two sets of metal grids.

The formation of GaAs photovoltaic cells is well known in the art. One preferred method of forming a GaAs cell is disclosed in the paper entitle "Epitaxial Growth from Organometallic Sources in High Vacuum" presented by L. M. Fraas, P. S. McLeod, L. D. Partain, and J. A. Cape at the Electronic Materials Conference in Boulder, Colo. on June 19, 1975. Said paper is incorporated herein by reference for all purposes.

The bottom GaSb cell comprises a conductive substrate, a layer of GaSb having regions of different conductivity forming a homojunction therein and contacting the conductive substrate, a passivating layer contacting the surface of the layer of GaSb opposite to the surface of the GaSb layer contacting the substrate, and means for forming electrical contacts to the substrate and the incident surface of the passivating layer.

The conductive substrate can be any material that enables the subsequently deposited semiconductor layers to grow in a crystal configuration suitable for photovoltaic cells. A suitable example is crystalline GaSb.

As shown in FIG. 1, the layer of GaSb has regions of different conductivity forming a homojunction therein. Below the homojunction is an n-type GaSb layer that contacts the conductive substrate. Above the homojunction, the GaSb layer is doped with a p-type dopant. A top passivating layer of $Al_yGa_{(1-y)}Sb$ contacts the surface of the GaSb layer which is incident to solar radiation. In FIG. 1, y is equal to 0.85. That figure also shows a means for forming electrical contacts to the layer of GaSb opposed to solar radiation and the incident surface of the top passivating layer.

One would expect a GaSb cell fabrication technology to closely parallel the GaAs cell fabrication technology in that AlGaSb window layers might be used to passivate the top surface of a GaSb cell. In fact, F. Capasso et al. (*Appl. Phys. Lett.*, 35, 165 (1980)) have used liquid-phase epitaxy to grow p-type AlGaSb window-passivated p-on-n GaSb photodiodes; and they have reported both the current versus voltage and spectral response characteristics for these devices.

The means for forming electrical contacts in the GaSb cell and the means for forming electrical contacts in the GaAs cell are aligned to prevent excessive shadowing of the GaSb cell.

FIGS. 2, 3, and 4 illustrate an exploded view, a cross sectional view and a top view, respectively, of a mechanically stacked photovoltaic cell package 10. The package 10 includes a base support member 12 of a suitable insulating material such as alumina ($Al_2O_3$) The base support member 12 contains regions of metallization 12a and 12b. These regions provide a means for forming electrical contact to the bottom GaSb cell 30 through the bottom heat spreader-electrical contact 14 and the electrode leads 32, 34, and 36. The metallization regions 12a and 12b can have any shape which permits the formation of electrical contact thereto, although the illustrated configuration is preferred for the contacts and heat spreaders illustrated. A suitable metallization is gold, silver, nickel plating, and the like. The insulating base support member aan be soldered to a suitable heat sink, not illustrated, such as a nickel-plated heat sink.

Contacting the base support member 12 through the metallization 12a is an electrically conductive bottom heat spreader-electrical contact 14. A suitable bottom heat spreader-electrical contact is fabricated from a suitable thermal expansion matching conductor such as molybdenum. The bottom heat spreader-electrical contact 14 also functions as part of the means for forming an electrical contact to the major surface of the cell which is opposed to solar radiation. Surrounding this bottom heat spreader-electrical contact 14 is a bottom insulating spacer 16. Preferably the bottom insulating spacer 16 is fabricated from an insulating material such as alumina or high temperature plastic and provides a space therein surrounding the bottom heat spreader-electrical contact 14 in which to position bottom GaSb cell 30. The bottom GaSb cell 30 is in electrical contact with the bottom heat spreader-electrical contact 14 and an electrode lead 32 for wiring into a module.

The bottom GaSb cell 30 is electrically contacted with suitable means for forming an electrical contact to the portion of the cell opposite to the incident surface. This combination comprises the bottom heat spreader-electrical contact 14, metallization 12a and an electrode lead 32. The incident surface of the cell is electrically wired into a module through electrode leads 34 and 36. Electrode lead 34 electrically contacts the incident surface of bottom GaSb cell 30 and the electrode lead 36 through the metallization 12b. This preferred configuration permits the bottom GaSb cell 30 to be isolated from the rest of the package 10 and thus minimizes the thermal expansion strains placed upon the bottom GaSb cell 30 during the heating thereof caused by solar radiation. Although less preferred, the electrode leads 34 and 36 can be configured if desired as a unitary piece. Of course, if electrode leads 34 and 36 were a single piece of metal then the metallization 12b would be unnecessary. The preferred configuration of the top and bottom leads to the bottom GaSb cell 30 is illustrated. Of course, depending upon the packaging the electrode leads 32, 34, and 36 need not be opposed but could be fabricated over but separated from each other. A further option, not illustrated, would be to have the metallization illustrated as 12b on base support member 12 applied instead on the bottom insulating spacer 16. This option would avoid the tab portion of electrode lead 34 from having to bend down from the incident surface of bottom GaSb cell 30 to the metallization 12b on base support member 12.

A top insulating spacer 18 such as alumina, a high temperature plastic, and the like, separates the bottom GaSb cell 30 from the top GaAs cell 50. The top GaAs cell 50 is electrically contacted on the bottom, i.e., the major surface opposite the incident surface through electrode leads 54 and 56 and the metallization 18a on the top insulating spacer 18. These bottom leads can also be configured as a single unitary piece. The incident surface of the photovoltaic cell is in electrical contact with a top heat spreader-electrical contact 20 for spreading the heat from the top GaAs cell 50 and the electrode lead 52. A suitable top heat spreader-electrical contact 20 is a molybdenum heat sink in contact with top GaAs cell 50. The electrode lead 52 can be any suitable metal. Of course, the top heat spreader-electrical contact 20 has a hole therein, as illustrated, for the passage of solar radiation.

Although the package assembly 10 has been described and illustrated with spacers and heat spreaders having a circular washer shaped configuration, any suitable configuration for the spacers and heat spreaders is possible provided they contain a space therethrough for which the solar radiation to enter into the top GaAs cell 50 and pass to the bottom GaSb cell 30. The contacts have preferably been illustrated having a Y-shaped configuration, however any suitable configuration for contacting the appropriate tops and bottoms of the cells is possible such as a rectangular a square tab shape. Furthermore, their thicknesses can be adjusted to provide a more compact or robust assembly as required for a particular application.

A benefit of the package design 10 permits module wiring configurations illustrated in FIG. 5. The package design 10 avoids the requirement for current matching of the top and bottom cells and replaces it with a voltage matching configuration. This wiring scheme benefits from the advantage that the voltage changes very little with variations in the solar spectrum or device degradation. It requires four independent leads from the cell package which is consistent with the package design described above.

More specifically, if the stacked cells were designed for series connection with currents matched at the beginning of life, the currents would be mismatched at the end of life with performance loss greater than the efficiency loss of the individual cells. Voltage matching provides a longer life design since the device voltages vary only logarithmically with current changes. FIG. 5 illustrates a six by two module wiring diagram for voltage matching of top and bottom cells whose output voltages differ by a factor of 3. For the twelve element configuration illustrated, six of the bottom and two of the top cells are connected in series to provide voltage matching. Different voltage ratios for different photovoltaic cells would require other series and parallel connection schemes for voltage matching, e.g., four by three, seven by five, five by three, etc. The only limitations on the interconnection schemes are the voltages of the different cells. Of course, different modules having specific output currents and voltages can be connected in series or parallel to provide any desired overall voltage or current output for a particular application.

FIG. 6 illustrates a three by one module wiring diagram for voltage matching of top and bottom cells whose output voltages differ by a factor of 3. For the three element configuration illustrated, three of the bottom and one of the top cells are connected in series to provide voltage matching.

While the present invention has been described with reference to specific embodiments, this application is intended to cover those various changes and substitutions which may be made by those skilled in the art without departing from the spirit and scope of the appended claims. Modifications which would be obvious to the ordinary skilled artisan, such as selection of particular top and bottom photovoltaic cells and configuration of the spreaders and insulators are contemplated to be within the scope of the invention.

What is claimed is:

1. An apparatus comprising mechanically stacked photovoltaic cells, comprising:
   (a) a bottom photovoltaic cell comprising:
      (a1) a conductive substrate,
      (a2) a layer of GaSb having regions of different conductivity forming a homojunction therein and contacting said conductive substrate,
      (a3) a bottom cell passivating layer contacting the surface of said layer of GaSb opposite to the surface of said GaSb layer contacting said substrate, and (a4) means for forming electrical contacts to said substrate and the incident surface of said bottom cell passivating layer and (b) a top photovoltaic cell comprising:
(b1) a layer of GaAs having regions of different conductivity forming a homojunction therein,
(b2) a top cell passivating layer contacting the surface of said layer of GaAs which is incident to solar radiation, and
(b3) means for forming electrical contacts to said layer of GaAs opposed to solar radiation and the incident surface of said top cell passivating layer;

wherein the means for forming electrical contacts in said bottom cell and the means for forming electrical contacts in said top cell are aligned.

2. A photovoltaic cell according to claim 1 wherein said bottom cell passivating layer is a layer of $Al_yGa_{(1-y)}Sb$.

3. A photovoltaic cell according to claim 2 wherein y has a value of about 0.85.

4. A apparatus according to claim 1 wherein said top cell passivating layer is a layer of $Al_xGa_{(1-x)}As$.

5. A apparatus according to claim 4 wherein x has a value of about 0.85.

6. An apparatus according to claim 1 further comprising wiring six GaSb cells in series for every two GaAs cells wired in series to form a module of predetermined output voltage under illumination.

7. An apparatus according to claim 1 further comprising wiring three GaSb cells in series for every GaAs cell wired in series to form a module of predetermined output voltage under illumination.

8. An apparatus comprising mechanically stacked photovoltaic cells, comprising:
(a) a base support member having opposed major surfaces;
(b) a bottom heat spreader-electrical contact contacting said base support member on a major surface thereof which is incident to solar radiation;
(c) means for electrically contacting said bottom heat spreader-electrical contact;
(d) a bottom insulating spacer surrounding said bottom heat spreader-electrical contact, said bottom insulating spacer having a space therein for a GaSb photovoltaic cell;
(e) a GaSb photovoltaic cell having opposed major surfaces and electrically contacting said bottom heat spreader-electrical contact on its major surface opposed to solar radiation, wherein said GaSb cell comprises
(e1) a conductive substrate,
(e2) a layer of GaSb having regions of different conductivity forming a homojunction therein and contacting said conductive substrate,
(e3) a bottom cell passivating layer contacting the surface of said layer of GaSb opposite to the surface of said GaSb layer contacting said substrate, and
(e4) means for forming electrical contacts to said substrate and the incident surface of said bottom cell passivating layer;
(f) means for electrically contacting the other major surface of said GaSb cell which is incident to solar radiation;
(g) a top insulating spacer contacting said bottom insulating spacer and having a space therein for a GaAs photovoltaic cell;
(h) a GaAs photovoltaic cell having opposed major surfaces, said GaAs cell having a bandgap energy responsive to solar radiation of shorter wavelengths than the band gap of said GaSb cell, wherein said GaAs cell comprises
(h1) layer of GaAs having regions of different conductivity forming a homojunction therein,
(h2) a top cell passivating layer contacting the surface of said layer of GaAs which is incident to solar radiation, and
(h3) means for forming electrical contacts to said layer of GaAs opposed to solar radiation and the incident surface of said top cell passivating layer;
(i) means for electrically contacting the major surface of said GaAs cell which is opposed to solar radiation;
(j) a top heat spreader-electrical contact contacting said top insulating spacer and the major surface of said GaAs cell which is incident to solar radiation, said top heat spreader-electrical contact having a space therein to provide for the passage of solar radiation to said GaSb and GaAs cells; and
(k) means for electrically contacting said top heat spreader-electrical contact.

9. The apparatus according to claim 8 where said means for electrically contacting said GaSb and GaAs cells and said bottom heat spreader-electrical contact comprise metallizations on said base support member and said top insulating spacer respectively.

10. The apparatus according to claim 9 wherein said means for electrically contacting the incident surface of said GaSb cell and said means for electrically contacting the major surface opposed to solar radiation of said GaAs cell each comprise at least two metallic tabs in electrical contact with each other and in respective contact with said metallizations on said base support member and said top insulating spacer.

11. The apparatus according to claim 10 wherein said top heat spreader-electrical contact and said bottom and top insulating spacers have a circular washer shaped configuration.

12. The apparatus according to claim 11 wherein said means for electrically contacting said bottom and top heat spreader-electrical contacts and said GaSb and GaAs cells have a Y-shaped configuration.

13. An apparatus comprising mechanically stacked photovoltaic cells, comprising:
(a) a base support member having opposed major surfaces;
(b) a bottom heat spreader-electrical contact contacting said base support member on a major surface thereof which is incident to solar radiation;
(c) means for electrically contacting said bottom heat spreader-electrical contact, wherein said means has a Y-shaped configuration;
(d) a bottom insulating spacer surrounding said bottom heat spreader-electrical contact, said bottom insulating spacer having a circular washer shaped configuration and having a space therein for a photovoltaic cell;
(e) a GaSb photovoltaic cell having opposed major surfaces and electrically contacting said bottom heat spreader-electrical contact on its major surface opposed to solar radiation, wherein said GaSb cell comprises
(e1) a conductive substrate, (e2) a layer of GaSb having regions of different conductivity forming a homojunction therein and contacting said conductive substrate, (e3) a bottom cell passivating layer of $Al_{0.85}Ga_{0.15}Sb$ contacting the surface of said layer of GaSb opposite to the surface of said substrate, and (e4) means for forming electrical contacts to said substrate and the incident surface of said bottom cell passivating layer;

(f) means for electrically contacting the other major surface of said GaSb cell which is incident to solar radiation, wherein said means has at least two metallic tabs in electrical contact with each other, wherein said tabs have a Y-shaped configuration;

(g) a top insulating spacer contacting said bottom insulating spacer, wherein said top insulating spacer has a circular washer shaped configuration and has a space therein for a GaAs photovoltaic cell;

(h) a GaAs photovoltaic cell having opposed major surfaces, said GaAs cell having a bandgap energy responsive to solar radiation of shorter wavelengths than the band gap of said GaSb cell, wherein said GaAs cell comprises (h1) a layer of GaAs having regions of different conductivity forming a homojunction therein, (h2) a top cell passivating layer of $Al_{0.85}Ga_{0.15}As$ contacting the surface of said layer of GaAs which is incident to solar radiation, and (h3) means for forming electrical contacts to said layer of GaAs opposed to solar radiation and the incident surface of said top cell passivating layer;

(i) means for electrically contacting the major surface of said GaAs cell which is opposed to solar radiation, wherein said means has at least two metallic tabs in electrical contact with each other, wherein said tabs have a Y-shaped configuration;

(j) a top heat spreader-electrical contact contacting said top insulator and the major surface of said photovoltaic cell which is incident to solar radiation, said top heat spreader-electrical contact having a circular washer shaped configuration and having a space therein to provide for the passage of solar radiation to said GaSb and GaAs cells; and (k) means for electrically contacting said top heat spreader-electrical contact, wherein said means has a Y-shaped configuration.

* * * * *

UNITED STATES PATENT AND TRADEMARK OFFICE
CERTIFICATE OF CORRECTION

PATENT NO. : 4,776,893
DATED : October 11, 1988
INVENTOR(S) : Paul S. McLeod et al.

It is certified that error appears in the above-identified patent and that said Letters Patent is hereby corrected as shown below:

Col. 9, Claim 13, lines 5-6, "$Al_{0.8-5}Ga_{0.15}Sb$" should read --$Al_{0.85}Ga_{0.15}Sb$--

Signed and Sealed this

Twenty-seventh Day of June, 1989

Attest:

DONALD J. QUIGG

Attesting Officer

Commissioner of Patents and Trademarks